United States Patent [19]

Csillag et al.

[11] 4,142,202
[45] Feb. 27, 1979

[54] MULTI-LAYER METAL CONNECTING CONTACT AND METHOD FOR MAKING IT

[75] Inventors: Andreas Csillag; Dieter Löcher, both of Leingarten; Klaus Wedermann, Neckarsulm, all of Fed. Rep. of Germany

[73] Assignee: Licentia-Patent-Verwaltungs-G.m.b.H., Frankfurt am Main, Fed. Rep. of Germany

[21] Appl. No.: 762,455

[22] Filed: Jan. 25, 1977

[30] Foreign Application Priority Data

Jan. 31, 1976 [DE] Fed. Rep. of Germany ....... 2603745
Jul. 30, 1976 [DE] Fed. Rep. of Germany ....... 2634263

[51] Int. Cl.² .......................................... H01L 23/48
[52] U.S. Cl. ...................................... 357/71; 357/67; 357/73
[58] Field of Search .............................. 357/71, 67, 73

[56] References Cited

U.S. PATENT DOCUMENTS

| 3,523,223 | 8/1970 | Luxem et al. | 357/71 |
| 3,850,688 | 11/1974 | Halt | 357/71 |

*Primary Examiner*—Edward J. Wojciechowicz
*Attorney, Agent, or Firm*—Spencer & Kaye

[57] ABSTRACT

A multi-layer metal connecting contact on a semiconductor body of a predetermined conductivity type comprises three gold layers on the semiconductor body, one on top of the next, with the middle layer containing an impurity material which produces the predetermined type of conductivity in said semiconductor body, and at least one further metal layer not comprising gold arranged on said gold layers.

The invention also includes a method of making such a multi-layer metal connecting contact.

9 Claims, 5 Drawing Figures

MULTI-LAYER METAL CONNECTING CONTACT AND METHOD FOR MAKING IT

BACKGROUND OF THE INVENTION

The invention relates to a multi-layer metal connecting contact on a semiconductor body of a certain type of conductivity, in which a layer consists of gold.

Connecting contacts on semiconductor bodies consisting of gold are already known. These gold contacts have a relatively low temperature resistance as the eutectic temperature between gold and the semiconductor material comprising silicon amounts to approximately 370° C. Semiconductor arrangements having these contacts cannot therefore be used for incorporation into glass cases since, for sealing through glass, temperatures between 500° and 700° C. are used.

SUMMARY OF THE INVENTION

It is an object of the invention to provide a multi-layer metal connecting contact which bonds well on to a semiconductor body and has a high temperature resistance. The contact should withstand at least temperatures up to 700° C. Moreover, the contact should have a low resistivity to the semiconductor body and the transition resistance to further connections is required to remain as small as possible.

According to a first aspect of the invention, there is provided a multi-layer metal connecting contact on a semiconductor body of a certain type of conductivity, in which a layer comprises gold, characterized in that a gold layer is arranged directly on said semiconductor body; that this gold layer is covered by a further gold layer, which contains an impurity material which produces the certain conductivity in said semiconductor body, that this gold layer is covered by a third gold layer and that at least one further metal layer not comprising gold is arranged on the gold layers.

According to a further aspect of the invention, there is provided a method of producing said multi-layer contact on a semiconductor body of a predetermined conductivity.

DESCRIPTION OF THE PREFERRED EMBODIMENTS

In a preferred embodiment of the invention, it is proposed that, in a multi-layer metal connecting contact of the type stated at the outset, a layer sequence comprising titanium-palladium-silver, or chromium-silver or nickel-silver is applied to the upper layer of gold, starting from this layer.

In this type of contact, the layers of gold ensure good bonding to the semiconductor body and a low resistance connection to the connected semiconductor region. An additional improvement in the transition properties between the metal and the semiconductor is produced by using a doping material in the middle layer of gold. As these doping materials reach the surface of the semiconductor body at a high temperature, they prevent the formation of barrier layers at this surface. This is true for a doping material generating the same type of conductivity present in said semiconductor body. As the layers of gold are sealed by further metal layers comprising Ti-Pd-Ag, Cr-Ag or Ni-Ag, the entire contact has a high temperature resistance and ensures moreover a low resistance connection to further connecting elements.

Furthermore, the described layer sequence has the substantial advantage that, before depositioning the covering layers made of Ti-Pd-Ag, Cr-Ag or Ni-Ag on the semiconductor arrangement, intermediate treatment methods may be carried out. Thus, for example, there is the opportunity for the electrolytic deposition of metal layers, after depositing the layers of gold, at another surface of the semiconductor body or at another region. Thus the multi-layer gold contact acts as a connection to the voltage source used during electrolytic deposition. Moreover, before deposition of the covering layers on the multi-layer gold contact which do not comprise gold, parts of the semiconductor body may be coated with a passivation layer which preferably consists of glass.

The described multi-layer metal connecting contact is particularly suitable for semiconductor components which are incorporated in a case at high temperatures. This is true, for example, for the so-called "DH-diodes", which are sealed in a glass casing. DH-diodes are also well known under the expression "double heat-sink diodes" or "plug-leads diodes". The contact is preferably applied to monocrystalline, n-conductive semiconductor bodies or semiconductor regions made of silicon.

BRIEF DESCRIPTION OF THE DRAWINGS

The invention will now be described in greater detail by way of example, with reference to the drawings, in which.

Figure 1:
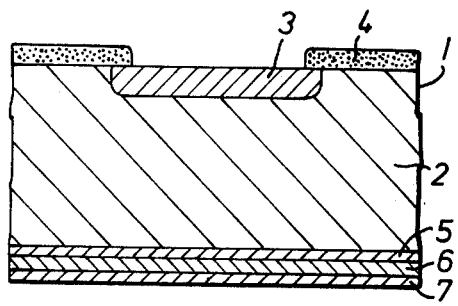
FIG. 1 shows in section a semiconductor diode after three layers of gold have been applied to one surface side.

Referring to the drawings, in FIG. 1 a semiconductor body 1 is shown which comprises for example n-conductive silicon. In order to manufacture a pn-junction, a p-conductive region 3 is diffused into the semiconductor body through an opening in an oxide mask 4 covering the semiconductor surface. In this way a diode is formed from the p-conductive region 3 and the n-conductive region 2, wherein the latter extends over the entire rear surface of the semiconductor body.

Three gold layers 5, 6, 7 are vapour deposited one after the other on to the rear side for the purpose of contacting the n-conductive region. The first gold layer 5 has a thickness, for example, of 0.15 $\mu$m and does not contain any impurities. The second gold layer 6 is for example 0.3 $\mu$m thick and contains an impurity material in a proportion of approximately 1%, this material being such as would produce the type of conductivity present in the region 2 in the semiconductor body. This impurity material is preferably antimony; however it may also comprise phosphorous or arsenic.

As a result of this gold layer penetrated by an impurity material, the donor density at the semiconductor surface is increased if the antimony atoms reach the semiconductor surface in a subsequent temperature process. The third layer 7 in turn comprises pure gold and preferably has a thickness of approximately 0.15 $\mu$m.

Figure 2:
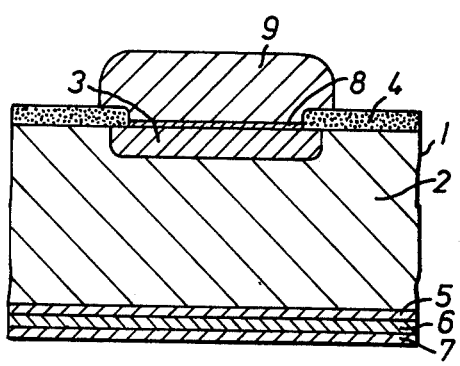
FIG. 2 shows the diode in a stage of manufacture after producing the top contact.

The metal connecting contact comprising 3 layers 5, 6, 7 is now required in accordance with FIG. 2 as an electrical connection in a subsequent electrolytic deposition process. First of all, however, in accordance with FIG. 2, a thinner front side contact 8 of the usual type is applied to the p-conductive region 3. This contact may be for example a layer sequence comprising titanium-palladium-silver. Then a thick mound 9 of silver is deposited in an electrolytic deposition process on this thin contact layer 8. This silver contact 9 has a thickness of approximately 20–50 $\mu m$.

Figure 3:
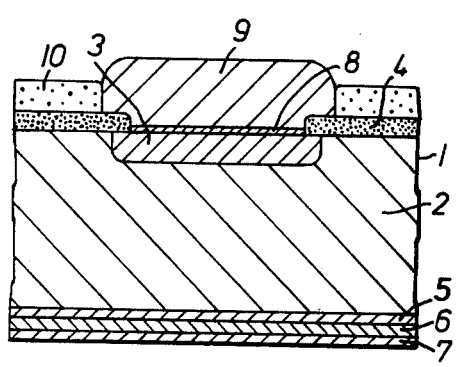
In FIG. 3 the diode is shown after passivation of the surface of the semiconductor by a layer of glass.

In accordance with FIG. 3 the surface of the semiconductor body covered by the oxide layer 4 is passivated by an additional glass layer 10. Thus the impurities are kept remote from the semiconductor body and inversion layers are prevented in the semiconductor body. This glass layer is melted on to the surface at a temperature of 500°–700° C. During this temperature process, antimony atoms reach the semiconductor surface from the gold layer 6 and ensure a low resistance connecting contact between the semiconductor body and the multi-layer metal contact which has been alloyed by the temperature treatment.

Figure 4:
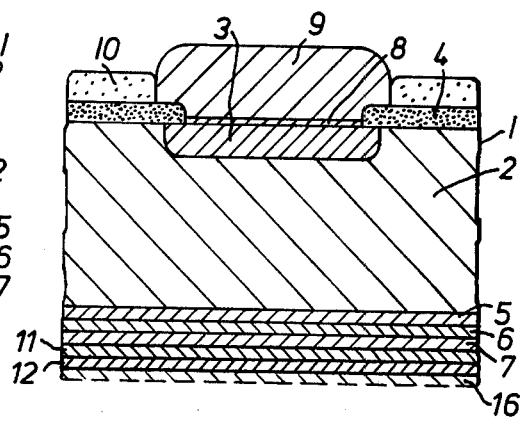
FIG. 4 shows the semiconductor diode after manufacture of all of the contact layers.

According to the intermediate treatment steps in accordance with FIG. 4, the remaining layers 11, 12 and in some cases 16 of the multi-layer connecting contact to the n-conductive region 2 are formed. At first, a layer 11 made of nickel which is for example 0.15 $\mu m$ thick or a titanium layer which is approximately 1,000 Å thick or a chromium layer which is approximately 500–1,000 Å thick is vapour deposited on to the upper gold layer 7. Then a layer 12 of silver or palladium is vapour deposited on to the layer 11. If the first layer 11 comprises nickel, the layer 12 is a silver layer approximately 0.1–0.6 $\mu m$ thick. With a lower layer 11 made of chromium, the layer 12 is a silver layer approximately 1,000 Å thick and with a lower layer 11 made of titanium, the layer 12 is a palladium layer approximately 500–1,000 Å. The layer sequence Ti-Pd for the layers 11 and 12 is completed by a silver layer 16 which is approximately 1,000 Å thick. The vapour depositing temperatures for the layers 11, 12, and in some cases 16 lie in the region of 350° C. or below.

Figure 5:
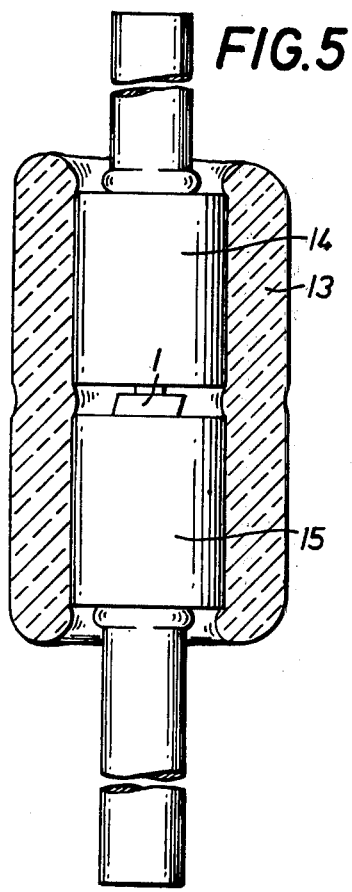
FIG. 5 shows the semiconductor diode incorporated into a DH casing.

Finally, the so-called "DH-diode" is shown ready for use in FIG. 5. Thus a diode in accordance with FIG. 4 is brought between two slugs 15, 13 which preferably comprise copper and have only a small thermal resistance to the silver contacts. The copper slugs 14, 15 are sealed in a glass casing 13 together with the semiconductor component 1. Thus a temperature of approximately 700° C. is necessary.

It has been proved that the semiconductor arrangements constructed in accordance with the invention no longer exhibit failures determined by the contacts. Moreover, in the described method it is possible to do without contact diffusions for the purpose of producing a low resistance connecting contact at a n-conductive semiconductor region. Furthermore there is the opportunity of undertaking electrolytic deposition in an intermediate stage of manufacture for the multi-layer connecting contact. The proposed contact may be arranged both at n- and also at p-conductive regions, so that, as a result, diodes for example may be provided with a p-conductive or with a n-conductive basis substances.

It will be understood that the above description of the present invention is susceptible to various modification changes and adaptations.

We claim:

1. A multi-layer metal connecting contact which is disposed on a semiconductor body, and in which at least one layer comprises gold wherein: a first gold layer is arranged directly on a portion of said semiconductor body, which portion is of a certain conductivity type; said first gold layer is covered by a second gold layer which contains an impurity material which produces said certain type of conductivity in the semiconductor material of said semiconductor body; said second gold layer is covered by a third gold layer; and a metal layer sequence of nickel and silver, of chromium and silver, or of titanium, palladium and silver is arranged on said third gold layer with the silver layer being the outer layer of said connecting contact.

2. A contact as defined in claim 1, wherein said impurity material contained in said second gold layer is taken from the group consisting of antimony, phosphorous and arsenic to enable said contact to be used for an n-conductive semiconductor region or body.

3. A contact as defined in claim 1, wherein said second gold layer contains said impurity material in a proportion of approximately 1%.

4. A method of manufacturing a metal connecting contact as defined in claim 7, wherein said gold layers are vapour deposited on to said portion of said semiconductor body one after the other; wherein thereafter said semiconductor body is heated at said temperature which lies above the eutectic temperature of said gold and said semiconductor material; and wherein finally the remaining metal layers are vapour deposited onto said gold layers.

5. A method as defined in claim 4, wherein after vapour depositing said gold layers on to parts of said semiconductor body, glass passivation layers are applied at temperatures between 500° and 700° C.; wherein thereafter a thick silver layer is electrolitically deposited at a further region of said semiconductor body; and wherein thereafter the said remaining layers are vapour deposited on to said gold layers.

6. A contact as defined in claim 1 wherein said semiconductor body is made of silicon.

7. A method of manufacturing a metal connecting contact for a portion of a semiconductor body which is of a certain conductivity type, comprising the steps of: depositing a first layer of gold directly on said portion of the semiconductor body; covering said first gold layer with a second gold layer which contains an impurity material which produces said certain types of conductivity in the semiconductor material of the semiconductor body; covering said second gold layer with a third gold layer; covering said gold layers with sequential metal layers of nickel and silver, of chromium and silver, or of titanium, palladium and silver; and heating the semiconductor body to a temperature which lies above the eutectic temperature of said gold and said semiconductor material.

8. A metal connecting contact for a semiconductor body formed according to the process of claim 7.

9. A semiconductor contact for a semiconductor body formed according to the process of claim 4.

* * * * *